(12) United States Patent
Airaksinen et al.

(10) Patent No.: US 7,435,665 B2  
(45) Date of Patent: Oct. 14, 2008

(54) CVD DOPED STRUCTURES

(75) Inventors: Veli Matti Airaksinen, Espoo (FI); Maria Elina Hokkanen, Itäsalmi (FI)

(73) Assignee: Okmetic Oyj, Vantaa (FI)

( * ) Notice: Subject to any disclaimer, the term of this patent is extended or adjusted under 35 U.S.C. 154(b) by 45 days.

(21) Appl. No.: 10/959,602

(22) Filed: Oct. 6, 2004

(65) Prior Publication Data

US 2006/0073679 A1 Apr. 6, 2006

(51) Int. Cl.
*H01L 21/20* (2006.01)
(52) U.S. Cl. .................................................... 438/478
(58) Field of Classification Search ......... 438/478–507; 117/89, 94
See application file for complete search history.

(56) References Cited

U.S. PATENT DOCUMENTS

| | | | | |
|---|---|---|---|---|
| 5,877,072 A | * | 3/1999 | Andideh et al. | 438/563 |
| 6,346,463 B1 | * | 2/2002 | Sultan et al. | 438/510 |
| 2003/0230233 A1 | * | 12/2003 | Fitzgerald et al. | 117/89 |
| 2005/0066892 A1 | * | 3/2005 | Dip et al. | 118/715 |
| 2005/0277272 A1 | * | 12/2005 | Singh et al. | 438/479 |

\* cited by examiner

*Primary Examiner*—Savitri Mulpuri  
(74) *Attorney, Agent, or Firm*—Patterson, Thuente, Skaar & Christensen, P.A.

(57) ABSTRACT

A new clean CVD growing process of dopant doped silicon layers comprising epitaxial silicon or polycrystalline silicon, has been developed. The process is occurring advantageously at a high growing temperature of 600-1250° C., having a phase in which silicon comprised halide is used as a silicon source gas with a dopant.

22 Claims, 4 Drawing Sheets

FIG. 1A known art

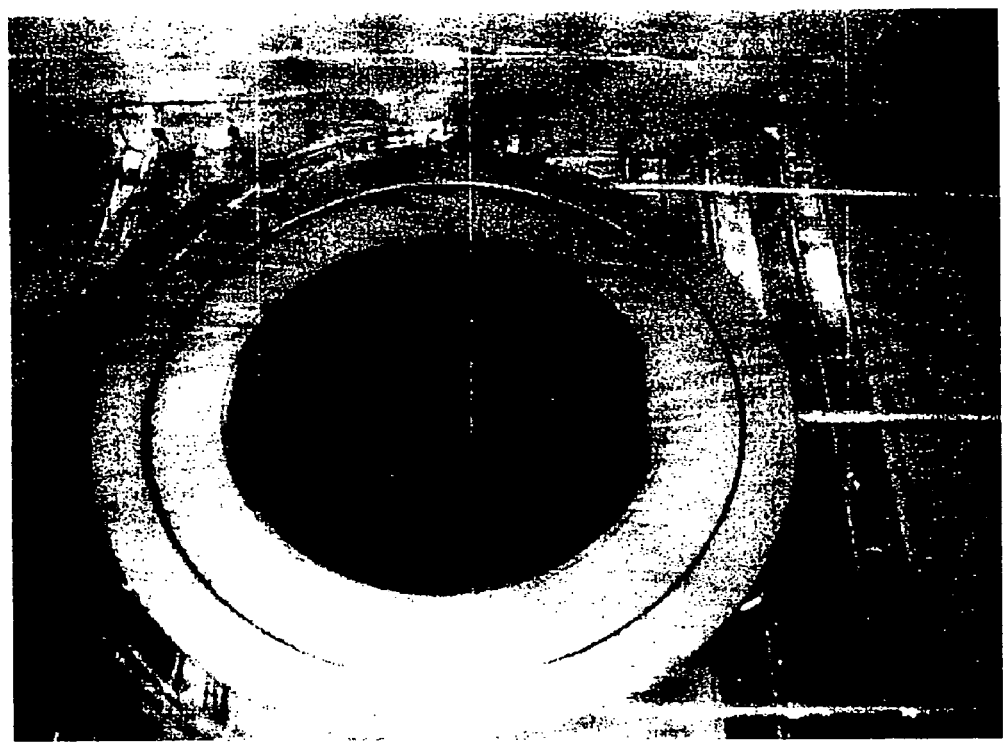
FIG. 5A
FIG. 5B known art

CVD DOPED STRUCTURES

BACKGROUND OF THE INVENTION

The present invention relates in a general level to techniques of manufacturing aspects of dopant doped silicon layers and a method for producing such doped layers. In more particularly, the present invention is concerned with a chemical vapor deposition (CVD) method for producing silicon layers doped with a dopant. The present invention relates also to an arrangement for manufacturing dopant doped silicon layers. The invention concerns several aspects. A first aspect of the invention concerns a growing process of dopant doped epitaxial silicon or polycrystalline silicon layers according to the preamble of an independent claim thereof. A second aspect of the invention concerns an arrangement according to the preamble of an independent claim thereof. A third aspect of the invention concerns a method of growing dopant doped silicon layer according to the preamble of an independent claim thereof. A fourth aspect of the invention concerns a use of halide as a precursor according to the preamble of an independent claim thereof. A fifth aspect of the invention concerns a surface structure according to the preamble of an independent claim thereof. A sixth aspect of the invention concerns a wafer according to an independent claim thereof.

For the sake of clarity, in the following the word "dopant" has been used to refer also to other elements than $3^{rd}$ group or $5^{th}$ group elements. In particular, dopant should be understood as a substance to be doped into a substrate and/or into a carrier matrix substance, including also the very high dopant concentrations of known CVD processes. In general if not otherwise indicated for a dopant, dopant concentration in a doped structure is smaller than that of the carrier matrix forming substance.

A CVD process basics has been known as such from its thousands of variants, for a long time for those skilled in the art. In the semi-conductor industry in a known process, layers are grown from the vapour phase on a substrate.

A surface structure on a wafer, for instance, can be grown as film layers with advantageous dopants, and/or etched away in order to have certain surface structure in a physical and/or compositional appearance. Such structure may serve as a key to gain certain optical, mechanical properties of the layers and/or electrical properties.

In certain fields of technology, in semi-conductor manufacturing for instance, the quality requirements of the substrate are very high for a certain composition of the surface layer for a specified application. In such a case it is crucial for the manufacturing process to minimize potential defects caused by contamination. In particular, this applies to surface defects such as particles, mounds, stacking faults, spikes and other defects known in the art.

Thin silicon layers which have properties different from those of the single crystal silicon substrate are commonly used for the processing of many types of semi-conductor devices and circuits. Such layers are typically between 0.1 μm and 100 μm thick but can be even thicker than 100 μm or thinner than 0.1 μm. The layers can be epitaxial, that is single crystalline, when grown on silicon; or they can be polycrystalline or amorphous when grown on a suitable intermediate layer, for instance an oxide or nitride layer. Instead of a single layer also multiple layers, either epitaxial, polycrystalline or amorphous, can be grown on top of each other as such, as known from the known techniques. If the layers are thin, low temperature deposition processes well below 1050° C. can be used. If the layers are thick, however, for instance over 1 μm or even over 10 μm, the deposition rate becomes important due to its effect on the throughput of the deposition equipment. For the deposition of such thick silicon layers high temperature CVD is commonly used.

A known CVD reactor comprises a quartz chamber. The word quartz here refers to any known reactor material of the chamber, comprising silica, suitable for CVD, irrespective on the actual reactor or the chamber material composition. The chamber is heated either with infrared and/or visible radiation, or by radio frequency (RF) radiation, induction based heating, or by combination of these. The heating affects directly mainly either the silicon wafer or the susceptor on which the wafer rests during the processing. Clean quartz does not absorb RF-radiation to any significant degree. However, quartz absorbs light and absorbs infrared radiation quite significantly. In addition, heat is transferred to the quartz walls due to absorption in silicon deposits on the quartz, or radiation and conduction from the substrate and susceptor. Therefore, the quartz wall of the reactor becomes quite hot during the CVD process.

A known CVD process utilises silicon containing source gas mixed with either an inert or a reducing carrier gas. Usually hydrogen ($H_2$) is used as a carrier gas and silicon hydrides (i.e. silane $SiH_4$), silicon chlorides (i.e. silicon tetrachloride $SiCl_4$,) or chlorosilicon hydrides, i.e. dichlorosilane (DCS, $SiH_2Cl_2$) or trichlorosilane (TCS, $SiHCl_3$) as silicon source gases. At high temperatures, above about 1100° C., the CVD processes can be capable of very high deposition rates of up to or over 5 μm/min depending on the design of the reactor, gas flow rates, temperature and pressure. In particular, relatively thick epitaxial and polycrystalline silicon layers are usually deposited using a high temperature of between 1050° C. and 1200° C. and either silicon tetrachloride or trichlorosilane as the source gas.

Epitaxial or polycrystalline silicon layers deposited using a known CVD can be doped substitutionally with impurity atoms to achieve suitable electrical or other properties of the resulting alloy. In particular, the conductivity of the layer can be adjusted with the dopants boron for p-type layers and arsenic, phosphorus or antimony for n-type layers. In addition, silicon can also be doped substitutionally and isoelectronically, i.e. without affecting the electrical conductivity, with the elements germanium and carbon. Typically used source gases for the dopants in such a CVD process are hydrides, for instance diborane, ($B_2H_6$) for boron; arsine ($AsH_3$) for arsenic, phosphine ($PH_3$) for phosphorus and germane (germanium tetrahydride, $GeH_4$) for germanium. Typical electrically active dopant atom concentrations in the grown layers are between $10^{13}$ $cm^{-3}$ and $10^{19}$ $cm^{-3}$. Both higher and lower concentrations are possible and also fairly commonly used. In particular highly boron doped p-type epitaxial layers with high boron concentrations of between $1 \cdot 10^{19}$ $cm^{-3}$ and $2 \cdot 10^{20}$ $cm^{-3}$ are quite commonly used because they exhibit a very low etch rate compared to moderately doped silicon when alkaline wet etchants, for instance potassium hydroxide (KOH), are used. Therefore, a highly boron doped layer can function as an effective etch stop in the wet etching of silicon. Such an etch stop layer can be used for instance for the fabrication of silicon micromechanical structures, comprising freestanding silicon membranes.

The heavily boron doped etch stop layer can form the freestanding silicon membrane. More often, however, the highly boron doped layer is used in a double layer structure in which the thin, highly doped p-type layer is covered with a moderately doped layer. Such a structure is used in known techniques to fabricate a silicon membrane from the upper layer which can be doped to a different concentration of either n- or p-type dopant. In such a case, the silicon substrate is first removed from the desired areas for instance with a combination of grinding and wet etching with an alkaline etchant. Thereafter the boron doped etch stop layer is removed with a suitable etchant to leave the surface structure formed by the moderately doped top silicon layer.

When silicon is doped according to the known techniques, to a concentration over $1 \cdot 10^{20}$ cm$^{-3}$ with boron, significant tensile stress results in such a doped layer due to the small size of the boron atom. This tensile stress causes wafer warpage and generally also a network of misfit dislocations and associated surface defects in the layer. Wafer warpage, surface defects and misfit dislocations can have undesirable effects on subsequent device processing and the properties of devices processed on such wafers. For this reason highly boron doped CVD-grown layers are usually counterdoped with germanium to prevent excessive stress in the layer. Stress compensation is due to the Ge atom being larger than B. In the CVD process germane (GeH$_4$) is commonly used as the germanium source gas either as a pure gas or more commonly in a dilute mixture with hydrogen. The desirable germanium concentration for stress compensation in the grown layer is approximately 6 times the concentration of boron. In addition to stress compensation Ge doping can also be used to modify the electronic band structure of silicon. For such purposes the germanium concentration in the SiGe alloy can be up to 20%, 30% or even higher. Recently Ge doping has also been used to create substrates for thin layers of strained silicon. In this application a relative thick layer of compositionally graded SiGe is grown on the silicon substrate. The layer is grown sufficiently thick, typically 1 to 3 µm, for the stress in the layer to become almost completely relaxed due to the formation of a dislocation network. When a thin layer of silicon is then grown on the relaxed SiGe-layer, the electronic band structure of the silicon layer is affected by the large tensile strain caused by the relatively large lattice constant of the relaxed SiGe, affecting the mobility of charge carriers in a beneficial way.

Another use of isoelectronic doping is to use carbon. Carbon is only soluble in silicon as estimated up to concentrations of perhaps 1-2%, depending on the temperature. However, carbon can still have a major effect on the electronic band gap properties of silicon. In addition, carbon tends to prevent the diffusion of boron at high temperatures, making it possible to achieve more abrupt interfaces between highly boron doped and moderately doped silicon layers.

Hydrides such as germane and diborane are easily decomposed at elevated temperatures leading to significant coating of the quartz chamber walls with dark deposits. These deposits increase the absorption of radiation by the quartz chamber and lead to a further increase in the quartz temperature. Furthermore, boron can react with quartz at high temperatures causing high stresses in the quartz chamber walls, which may eventually cause the chamber to crack. As a result, in the known techniques, the highly doped silicon layers are usually deposited at a relatively low temperature, usually around 1000° C. for heavily boron doped layers, or at even much lower temperatures for SiGe and carbon doped silicon.

In a known process Si$_2$H$_2$Cl$_2$ dichlorosilane or SiH$_4$ silane are usually used as the source gas in low temperatures for keeping the deposition rates in acceptable level. In addition, in spite of the lower process temperature the quartz chamber still becomes coated with deposits, which need to be removed with long etching processes using a suitable gaseous cleaning agent such as hydrogen chloride (HCl). Both the low deposition rate and the long etching times of known techniques reduce the throughput of the CVD equipment and thus increasing the cost of depositing the highly doped layers. In addition, both dichlorosilane, silane and germane gases are very expensive further increasing the cost.

Surface defects created during epitaxy tend to be detrimental for subsequent device processing done on epitaxial wafers. Wafer bonding is particularly sensitive to such defects. Typically the height of the epitaxial surface defects is proportional to the thickness of the epitaxial layer. Therefore, surface defects tend to be much more detrimental on thick epitaxial layers than on thin layers. Surface defects are usually caused by foreign material on the substrate surface, for instance a particle or an oxide island. Oxide islands have a greater tendency to form at low temperatures where the reducing hydrogen atmosphere is less effective in preventing their formation. In addition, easily decomposable gases such as hydrides have a tendency to react in the gas phase of the epitaxial reactor, thus forming small particles which can then induce the formation of surface defects. An additional source of particles in the CVD reactor is the undesirable deposits formed on the quartz walls.

FIG. 1A demonstrates a known CVD-process as such having duration from the beginning (0) to moment n demonstrated on the horizontal time axis, however the moments and units are indicated in arbitrary units, just for a demonstrative purposes. The substrate is transferred into the reactor chamber at the beginning of the process at a starting temperature indicated by the word "Start" in the figure. The substrate is heated from beginning to a moment of time kn1 in a H$_2$ atmosphere as preparing for removing an oxide layer from the surface between moments kn2 and kn1, in an elevated temperature T. This is indicated in the figure by the word "Bake". When the oxide from the substrate surface is removed, the process temperature is changed at kn2 corresponding the conditions of the deposition of the doped layer. The layer is grown during a time interval from moment kn2 to a moment kn3. It is demonstrated in the figure, to be done in an H$_2$ atmosphere and by using GeH$_4$ as the germanium source and SiH$_2$Cl$_2$ (DCS) as silicon source. When the necessary layer thickness is achieved, the feed of the source gases is stopped. The temperature is lowered at a moment of time kn3; the substrate is cooled whilst maintaining the carrier gas flow through the chamber. After the temperature has been lowered sufficiently, for instance to or below about 900° C., the substrate with the layer is taken away from the reactor. Following the removal of the substrate the reactor is heated rapidly to a suitably high temperature, for example around 1200° C. to heat the chamber walls for removing the undesirable deposits with a gaseous etchant. At the moment kn4 the etching of the CVD-chamber, the reactor, begins, and continues to a moment kn5. After the moment kn5 the reactor is ready for depositing the next layer. Etching is indicated in FIG. 1A to be done by HCl as an etchant, but other kind of etchants can be used as well depending on the known process detail.

In FIG. 1A, in order to get a sufficient layer structure thickness in a low temperature T the deposition time kn3-kn2 for the doped layer on the substrate is a quite long and occurrence probability of particles is also quite high. Especially because of the thermal decomposition properties of the precursors and also because long times allow also slower reactions to occur and may lead to particle formation in the reaction chamber, not only in the volume but also on the inner surfaces of the chamber, and the substrate still being therein.

In FIG. 1A in the etching phase the etching time kn5-kn4 is aimed to remove all kinds of deposits from the empty reactor in an elevated temperature. During that phase quite a lot of chemicals are removed from the chamber, more or less as waste. For sufficient cleanliness for a next substrate, the etching time should be long enough, and generally the interval kn3-kn2 should be proportional to interval kn5-kn4. Consequently, much of chemicals are wasted if compared to their amount on the substrate surface and the known process occurs relatively slowly.

Thus, there is a need for a faster, cleaner and cheaper CVD process for depositing highly doped, thick silicon layers of high surface perfection.

SUMMARY OF THE INVENTION

It is an object of the invention to improve the process and mitigate the defects of the known techniques, which goal is achieved by embodiments of the invention, in which a CVD process utilizing a higher growing temperature and halide precursors is applied.

According to the first aspect of the invention a CVD growing process is provided for growing on a substrate dopant doped silicon layers comprising epitaxial silicon or polycrystalline silicon, wherein the process is characterized in that in a growing temperature between 600° C. and 1250° C., the growing process comprises a phase in which silicon comprised halide is used as silicon source gas.

According to an embodiment of the invention and the first aspect thereof, the growing temperature is set to a first value between 600° C. and 1250° C. for a first time-interval for doping of a first dopant, and the growing temperature is set to a second value between 600° C. and 1250° C. for a second time-interval for doping of a second dopant. According to a further embodiment of the invention, the first value is different than said second value for the growing temperature. According to another further embodiment of the invention, the first dopant is the same as said second dopant. However, sum of said first and said second time intervals is shorter than the total growing phase period in the process embodied with said first and said second time-intervals. Such an embodiment can be used when the first dopant in a layer and the second dopant in another layer are desired or differently structured layers comprising a dopant are desired, for instance.

According to an embodiment of the invention, the temperature and/or the gas flow can be varied according to a predetermined program or scheme. The scheme can be implemented in a stepwise way or in a continuous way in order to rise and/or lower the temperature and/or the gas flow. So, different kind of distance dependent concentration gradients in a layer across the layer thickness can be made for a dopant into the layer via adjusting the deposition rate of the gases.

According to an embodiment of the invention and the first aspect thereof, the process comprises a phase in which sheath gas flow is used for temperature distribution optimization. According to an embodiment of the invention such sheath gas comprises a noble gas component.

According to an alternative embodiment of the invention and the first aspect thereof, the growing temperature in which the substrate is heated is in a sub range of 600-1250° C., said sub range comprising a range of 700-900° C.

According to an alternative embodiment of the invention and the first aspect thereof, the growing temperature in which the substrate is heated, is in a sub range of 600-1250° C., said sub range comprising a range of 900-1050° C.

According to an alternative embodiment of the invention and the first aspect thereof, the growing temperature in which the substrate is heated is in a sub range of 600-1250° C., said sub range comprising a range of 1050-1250° C.

According to an embodiment of the invention and the first aspect thereof, the process further comprises a phase for a short etching of a CVD chamber, a phase in which the CVD chamber is exposed in a high temperature to an etchant. According to a further embodiment a halidic etchant is used.

According to an embodiment of the invention and the first aspect thereof, said silicon comprised halides to be used as silicon source gases are compounds of form of formula $Si_xH_y\text{-}Hal_z$, wherein the letters x, y and z indicate relative amounts of silicon, hydrogen and a halogen Hal species, respectively, however the indexes x, y and z to be selected in a stoichiometric relation determined according to the Si-valences for bonding H or Hal.

According to an embodiment of the invention and the first aspect thereof, x is advantageously equal or less than 4. According to an alternative embodiment of the invention, also another type of silicon halides with higher x may be used, provided sufficient stability in a CVD process applied. However, according to a more advantageous embodiment of the invention x is less than 4, but according to even more advantageous embodiment of the invention equal or less less than 4, but according to even more advantageous embodiment of the invention equal or less than 2.

According to an embodiment of the invention and the first aspect thereof, y is advantageously equal or less than 2x+2.

According to an embodiment of the invention and the first aspect thereof, z advantageously equals to 2x+2 minus y.

According to an embodiment of the invention and the first aspect thereof, said halides comprise one halogen species.

According to an embodiment of the invention and the first aspect thereof, said halides are halogen compounds of multi-halogen species. Such multi-halogen species can be applied for an embodiment of the invention, provided a sufficient stability and/or incapability to form particles harmful to the grown layers on substrate at the growing temperature.

According to an embodiment of the invention and the first aspect thereof, a dopant of the process comprises at least B, Ge, C, As, Sb, Sn, Ge, Ga, In or P. Such dopants can be applied to provide different kinds of layers to vary i.e. conductivity and/or stress of the layers on the substrate.

According to an embodiment of the invention and the first aspect thereof, said dopant comprising precursor additionally comprises at least H or halogen advantageously in a stoichiometric relation. Using halogens in the dopant comprising precursors the process growing temperature can be kept high and so favoring process conditions free of harmful particles and thus keeping the process clean.

According to an embodiment of the invention and the first aspect thereof, a surface structure on a substrate surface comprises a dopant doped layer of silicon, wherein the concentration of dopant atoms in a layer can yield a concentration above $10^{18}\,cm^{-3}$, providing so a large scope of applicability to several purposes electrical and/or mechanical aspects of microelectronics, for instance.

According to an embodiment of the invention and the first aspect thereof, a surface structure on a substrate surface comprising a dopant doped layer of silicon, wherein the concentration of dopant is equal or larger than $10^{19}\,cm^{-3}$, according to a further embodiment, advantageously larger than $10^{20}\,cm^{-3}$.

According to an embodiment of the invention and the first aspect thereof, the pressure in the process where said precursor is used is essentially pressure of atmosphere.

According to an embodiment of the invention and the first aspect thereof, the pressure in said process is lower than an atmospheric pressure.

According to the second aspect of the invention, an arrangement for a CVD growing process is provided for growing dopant doped epitaxial silicon or polycrystalline silicon layers, wherein the arrangement is characterized in that the arrangement comprises heating means for heating the reaction chamber of the process into a growing temperature, which is between 600° C. and 1250° C., silicon source means for providing silicon source gases into the process, dopant means for providing a dopant into the process for the doping, a reaction chamber and cleaning means to clean the reaction chamber with a cleaning agent.

According to an embodiment of the invention and the second aspect thereof the arrangement comprises means for providing a gaseous etchant into the process for cleaning the reaction chamber and the parts thereof.

According to an embodiment of the invention and the second aspect thereof, such a silicon source is based on silicon halide, such as $SiCl_4$, $SiH_2Cl_2$ or $SiHCl_3$.

According to an embodiment of the invention and the second aspect thereof the arrangement further comprises sheath gas means arranged to protect the substrate by a sheath gas atmosphere.

According to an embodiment of the invention and the second aspect thereof, such arrangement can comprise sheath gas means for providing sheath gas to the substrate surface during a change in the reactor atmosphere composition.

According to the third aspect of the invention a method of growing is provided, for growing dopant doped silicon layer in a CVD process said layer comprising epitaxial silicon or polycrystalline silicon, wherein the method is characterized in that it comprises transferring a substrate into a deposition chamber, heating the substrate and maintaining at a growing temperature, which is between 600° C. and 1250° C., growing a layer on the substrate by a halide precursor comprising a dopant and/or by using silicon comprised halide as a silicon source gas.

According to the fourth aspect of the invention use of a halide as a precursor, in a growing process by CVD for growing dopant doped epitaxial silicon or polycrystalline silicon, is characterized in that the growing temperature in the process is between 600° C. and 1250° C.

According to an embodiment of the invention and the fourth aspect thereof, a silicon halide can be used as a silicon source gas in the growing of epitaxial silicon or polycrystalline silicon for a layer structure in a growing process by CVD in a growing temperature, which is between 600° C. and 1250° C.

According to an embodiment of the invention and the fourth aspect thereof, such a silicon halide is a chloride. According to an embodiment of the invention the silicon halide is $SiCl_4$ or $SiHCl_3$.

According to an embodiment of the invention and the fourth aspect thereof, the silicon halide is $SiH_2Cl_2$.

According to an embodiment of the invention and the fourth aspect thereof, a halide can be used as a precursor for doping epitaxial silicon or polycrystalline silicon in a growing process by CVD in a growing temperature, which is between 600° C. and 1250° C.

According to an embodiment of the invention and the fourth aspect thereof, such a precursor can be used for a dopant in doping, which precursor comprises a halide comprising at least one of the following: antimony, arsenic, boron, carbon, germanium, tin, gallium, indium and phosphorus.

According to an embodiment of the invention and the fourth aspect thereof, the precursor to be used comprises a halide being at least one of the following $BCl_3$, $B_2Cl_4$, $GeCl_4$, $GeHCl3$, $GeF_4$, $GeBr_4$, and $GeI_4$ According to an embodiment of the invention and the fourth aspect thereof, $BCl_3$ is used for boron doping of epitaxial silicon or polycrystalline silicon growing process by CVD, in a growing temperature which is between 600° C. and 1250° C., and $SiCl_4$, $SiH_2Cl_2$ or $SiHCl_3$ is used as silicon source gas. Said boron halide is a sufficiently stable in the growing temperature range of the CVD process.

According to an embodiment of the invention and the fourth aspect thereof, $GeCl_4$ is used for germanium doping of epitaxial silicon or polycrystalline silicon growing process by CVD in a growing temperature, and $SiCl_4$, or $SiHCl_3$ is used as silicon source gas. Said germanium halide is a sufficiently stable in the growing temperature range of the CVD process.

According to an embodiment of the invention and the fourth aspect thereof, other sufficiently stable boron halides are used for boron doping of epitaxial silicon or polycrystalline silicon growing process by CVD in a growing temperature.

According to an embodiment of the invention either $SiCl_4$ or $SiHCl_3$ is used as silicon source gas for the growing of the layer in a CVD process.

According to an embodiment of the invention and the fourth aspect thereof, other sufficiently stable germanium halides, for example ($GeHCl_3$, $GeF_4$, $GeBr_4$, $GeI_4$), are used for germanium doping of epitaxial silicon or polycrystalline silicon growing process by CVD in a growing temperature.

According to an embodiment of the invention and the fourth aspect thereof, sufficiently stable carbon halides are used for carbon doping of epitaxial silicon or polycrystalline silicon growing process by CVD in a growing temperature.

According to an embodiment of the invention and the fourth aspect thereof, sufficiently stable arsenic halides are used for arsenic doping of epitaxial silicon or polycrystalline silicon growing process by CVD in a growing temperature.

According to an embodiment of the invention and the fourth aspect thereof, other suitably stable phosphorus halides are used for phosphorus doping of epitaxial silicon or polycrystalline silicon growing process by CVD in a growing temperature.

According to the fifth aspect of the invention a surface structure, on a substrate, is characterized in that said structure comprises a dopant doped layer of silicon, said layer being made by a process according to which dopant doped silicon layers comprising epitaxial silicon or polycrystalline silicon is grown in temperature of 600-1250° C. and the growing process comprises a phase in which silicon comprised halide is used as silicon source gas, wherein the ratio of dopant to silicon atoms in the layer is above $10^{-5}$.

According to the sixth aspect of the invention a wafer according to it, is characterized in that it comprises on a substrate a surface structure according to the fifth aspect of the invention.

According to an embodiment of the invention and the sixth aspect thereof, epitaxial wafer contains one or several highly doped layers manufactured according to a process according to an embodiment of the invention.

According to an embodiment of the invention and the sixth aspect thereof, such a silicon wafer contains one or several highly doped layers manufactured according to an embodiment of the invention. According to an embodiment of the invention, such wafers can be used for wafer bonding.

DESCRIPTION OF THE FIGURES

FIG. 1A describes a known CVD process. FIG. 5B illustrates a photograph of a reactor used in a process according to the known art. Therefore, in the following description embodiments of the invention are described and illustrated in an exemplary way with a reference to the following figures in which

DETAILED DESCRIPTION OF THE PREFRRED EMBODIMENTS

Figure 1B:
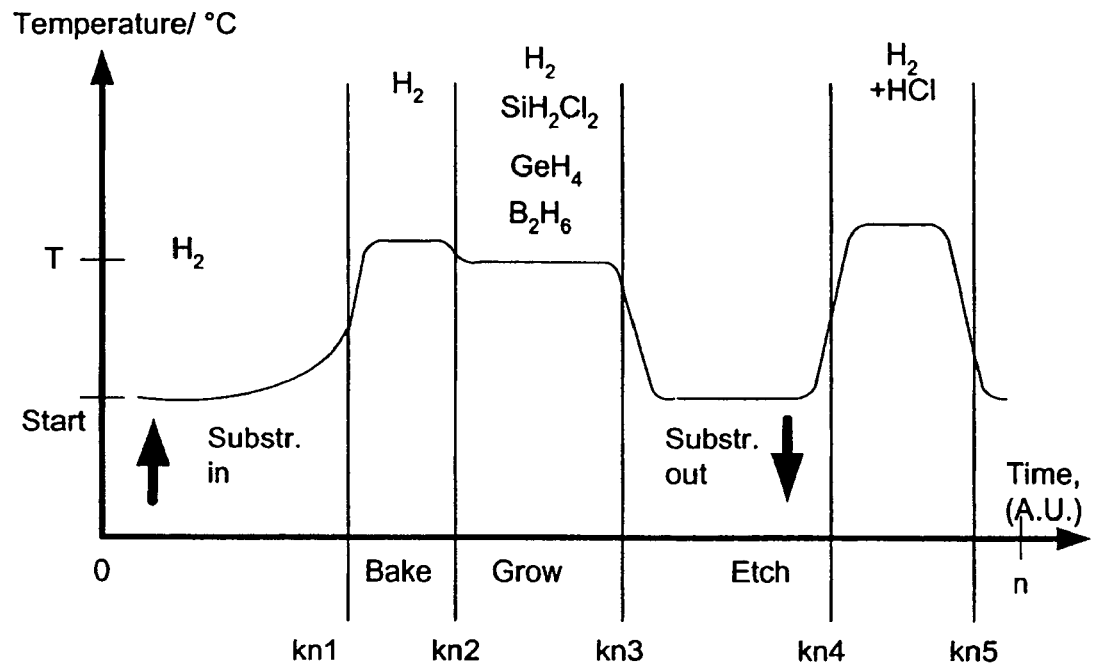
FIG. 1B illustrates a process according to an embodiment of the invention.
Figure 1B:
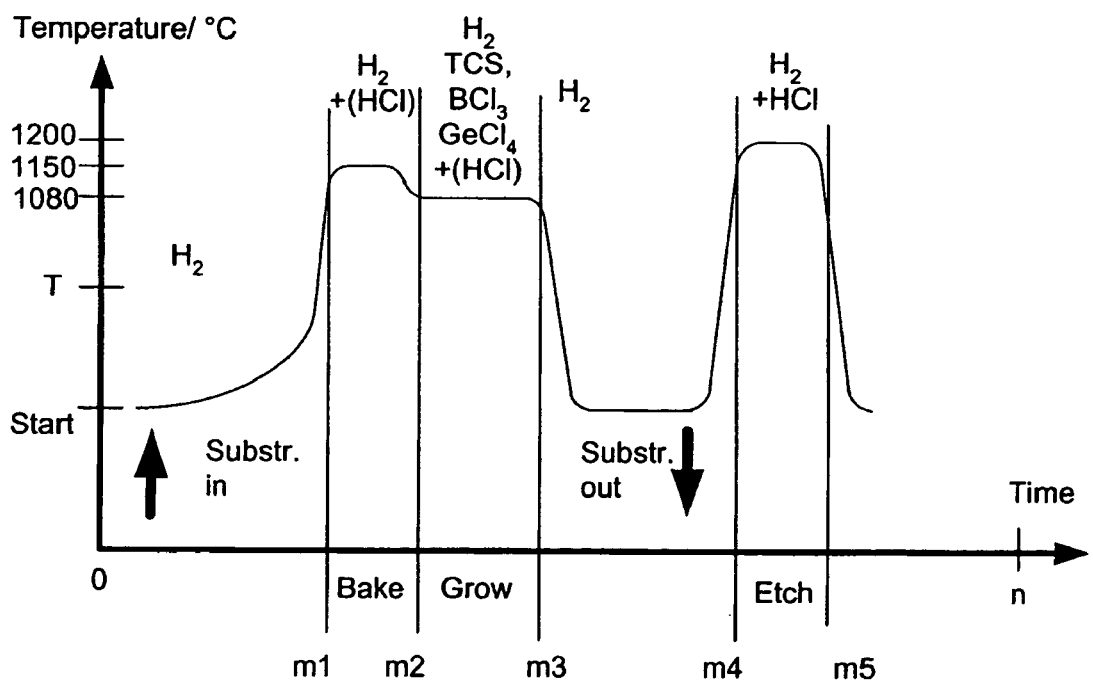

Embodiments of the invention can be combined in a suitable part, even between the various aspects of the invention, to have a more complete disclosure of the examples of the various embodiments of the invention. However, that should not be understood as any kind of limitation purpose to the scope of the claimed and explained embodiments of the invention apparent in the following. Any shown numerical values should not be considered as any kind of limitation to the scalability of the process parameters, but should be considered rather only as examples on the embodiments of the invention.

The term precursor has been used as it could comprise in the following a dopant and/or a silicon source gas, but without limiting the composition of the precursor as such in a stable form.

A new CVD process according to the invention was developed for the deposition of B- and Ge-doped silicon. In this process, hydrides were replaced by chlorides as source gases for B and/or Ge. The use of chlorides, for example boron trichloride ($BCl_3$,) and germanium tetrachloride ($GeCl_4$), improves the process even at low growing temperatures of 600° C. to 1000° C. because of reduced deposits on the reaction chamber walls. In addition chlorides also allow higher process growing temperatures of 1000° C. or above to be used because the coating of the quartz chamber by boron and germanium containing compounds is greatly diminished. In addition, it is believed that this beneficial effect is mainly due to halides being more stable than hydrides.

At lower growing temperatures silane, disilane or dichlorosilane can be used as the silicon source gas. At high growing temperatures the process allows either trichlorosilane or silicon tetrachloride to be as silicon source gas.

According to embodiments of the invention, higher process growing temperatures allow halidic source gases to be used. Especially advantageous silicon source gases can be either trichlorosilane or silicon tetrachloride. The higher deposition temperature and the higher flow rates of source gases makes possible much higher deposition rates of 3 to 4 μm/min and even over 5 μm/min, thus reducing the deposition time. The total process time is favorably affected by the much smaller tendency of boron and germanium to deposit on the chamber walls reducing the time required for chamber etching. In addition, the gases used in a process according to an embodiment of the invention are cheaper (at least at the priority date of the current application) than those used in a known techniques for the lower growing temperature process, the embodiments of the invention thus further decreasing the costs. Due to the high growing temperature surface defects caused by oxide islands are avoided in a process according to an embodiment of the invention. In addition, the much reduced tendency to form deposits on the quartz walls, and the avoidance of gas-phase reactions by the use of chlorides help, in a process according to an embodiment of the invention, to avoid surface defects due to particles. Thus the resulting wafer surface is much better suited for the manufacturing of discrete electronic devices, integrated circuits and for semiconductor manufacturing processes comprising wafer bonding or lithography, for example for MEMS (Micro-Electro-Mechanical System), MOEMS (Micro-Opto-Electro-Mechanical Systems) or MST (Micro System Technology) applications.

Embodiments of the invention according to the first aspect describe a process for depositing crystalline or polycrystalline, doped silicon films at high deposition rates and superior yield of non-defected products. Such a process is illustrated in FIG. 1B. The processing times in certain phases are indicated in the figure. In the horizontal time axis also moment n is marked to schematically illustrate the speed of the new process. However, the moments are shown without particular units, as just for an illustrative purpose. One should notice, that the moments of time such as m1, m2, m3, m4 and m5 are indicated by vertical lines at the edges of the major temperature changes of the process. But because of a real process do not have strictly vertical edges between process steps, the beginnings and/or the endings of a process phases that have an edge at certain moments, have been drawn as there were an edge essentially at the moment indicated by the vertical lines in the FIG. 1A.

In a process according to an embodiment of the invention, the CVD process chamber is heated up, to the moment of time m1, by visible and infrared radiation, but the heating could equally well be inductive or a combination of inductive heating and visible or infrared radiation. If a silicon wafer is used as substrate, the native silicon oxide layer may be removed from the wafer by heating the wafer to above 1000° C. Prior to deposition the wafer is heated from a starting temperature around 900° C. at the beginning (0) to the temperature for removal of native oxide. In a preferred embodiment of the invention, the oxide removal temperature is 1150° C., gained essentially at moment m1, but this temperature can vary according to the epitaxial process or the wafer preparation prior to the epitaxial process. Also an etchant, as indicated by HCl, can be used to enhance oxide removal in a further variation of the embodiment. Advantageously the etchant is chosen to comprise elements present due to the composition of the precursors. After removing the native oxide during the time interval m2-m1, the wafer temperature is adjusted for the processing to a growing temperature which can be up to 1250° C., but is preferably above 1000° C. and less than 1200° C. and in an embodiment of the invention, most preferably above 1050° C., but below 1120° C. In the embodied example that temperature is indicated as 1080° C., for the growing phase in the time interval m3-m2. Although the example on the process according to an embodiment of the invention is embodied with a constant growing temperature, the growing temperature can be varied in another embodiment of the invention.

The pressure in the process chamber is maintained near atmospheric pressure. However, the process, arrangement nor the method is limited to atmospheric pressure conditions solely, but the embodiments of the invention can be applied at reduced pressure or even at elevated pressures above one atmosphere without deviating from the scope of the embodiment of the invention. A reactant gas mixture comprising a silicon containing gas, such as, but not limited to, trichlorosilane (TCS), a dopant gas or gases, such as, but not limited to, boron trichloride or germanium tetrachloride, and a carrier gas containing an inert gas such as argon or helium, or a reducing gas such as, but not limited to, hydrogen ($H_2$) is fed into the deposition chamber.

According to an example of a preferred embodiment of the invention, the carrier gas $H_2$ is fed into a deposition chamber, acting as a reactor, designed for a certain size of a substrate and/or wafer, at a flow rate of 40 standard liters per minute (SLM). The flow rate of the carrier gas can vary quite widely from one application of an embodiment to another, however, depending on the geometry and volume of the reaction chamber, the silicon source gas, flow rate, growing temperature, pressure and also other such parameters that as such are known to those skilled in the art. Such parameters are not indicated in the figures for clarity reasons. The silicon source gas is a mix of TCS (trichlorosilane) and hydrogen, produced by letting hydrogen gas flow through liquid TCS in a bubbler. TCS flow rate can be up to 25 grams per minute, but preferably less than 15 grams per minute and most preferably about 2 to 5 grams per minute, but preferably, not less than 1.0 grams per minute in the accuracy applied for the reactor. For instance, boron doping is achieved by feeding $BCl_3$ gas into the chamber. The $BCl_3$ from the source may be used as a pure gas or as mix comprising $H_2$, He or some other suitable carrier gas. The flow rate of the boron containing gas is adjusted to obtain the desired concentration of boron in the grown layer. According to an embodiment of the invention, the concentration of B can be over $5 \cdot 10^{19}$ cm$^{-3}$. According to an exemplary embodiment of the invention, germanium doping is achieved with a $GeCl_4/H_2$ mix produced by bubbling $H_2$ gas through liquid $GeCl_4$ in a bubbler. The flow rate of $H_2$ is adjusted to obtain the desired concentration of Ge in the grown layer. A Ge concentration can be achieved, which is over $5 \cdot 10^{19}$ cm$^{-3}$ and up to $5 \cdot 10^{22}$ cm$^{-3}$.

Those skilled in the art can see from the description of the embodiments of the invention, that introducing the precursors into the process in a different way other than exemplary embodied bubblers for instance, does not deviate from the scope of the invention.

In an exemplary process according to a preferred embodiment of the invention HCl is mixed with carrier gas during the deposition. Depending on the deposition parameters, a preferred flow rate of the HCl can be between 0 SLM and 2 SLM in an advantageous embodiment of the invention, but between 0.05 SLM and 0.1 in an even more advantageous embodiment of a preferred embodiment. When the wafer has a sufficient layer thickness, it can be taken out of the reactor between m4 and m3 in FIG. 1B. However, when cooled sufficiently for taking it out when ready.

The use of halides as dopant sources improves significantly the cleanliness of the process. The growth of undesirable deposits on the reactor chamber walls and other parts within the chamber can be further reduced by the introduction of a suitable gaseous etchant (HCl for instance) during the process. Because a higher temperature and the stable precursors according to the embodiments of the invention, the growing time m3-m2 can be short, at least shorter than kn3-kn2 in the known techniques. Consequently, the etching time m5-m4 is short, at least shorter than kn5-kn4 in the known techniques.

Those skilled in the art however knows from the embodiments of the invention, that there are many ways to vary as such the taking out the substrate, etching and/or growing a next layer on the substrate or cascading the phases with several reactors, however, independently on the embodied layer structure and/or the sub-layers, without leaving the scope of the protection of the current invention.

Figure 1C:
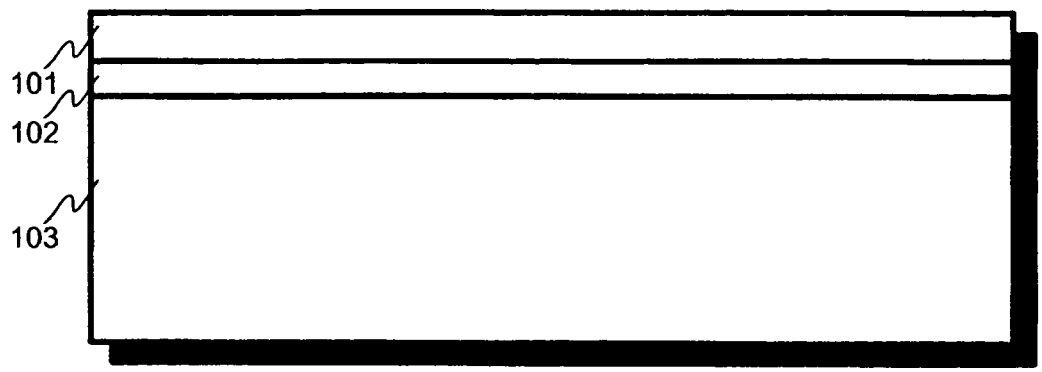
FIG. 1C illustrates a cross sectional diagram of the grown wafer.

FIG. 1C illustrates schematically a cross section of a grown wafer 103 with highly B-doped epitaxial layer of SiGeB 102 buried under a thicker, lightly doped layer 101. The SiGeB layer 102 may be 0.5 to 5 μm thick, but the thickness is not limited to the said values, which are only examples for an ensemble of embodiment of the invention. The thickness of the lightly doped epitaxial (epi) layer can be between from few micrometers to 40 μm for an exemplary embodiment of the invention, even thicker. However, the thickness is not limited to the shown values.

Figure 1D:
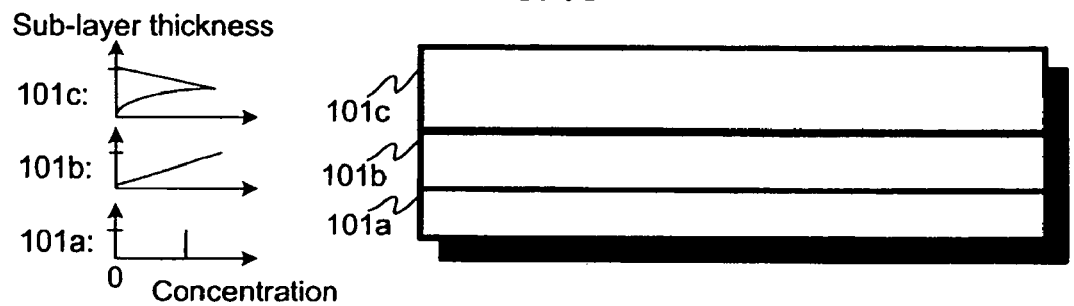
FIG. 1D illustrates a sub-layer structure.

In addition, the concentration of a dopant in a layer 101, 102 does not need to be constant, but the concentrations may vary to produce a multilayer, or a sandwich-type structure. This is demonstrated in a FIG. 1D, where the dopant concentration may be changing according to a function of a measured distance from the substrate surface to the doped layer's further surface as the 101 for instance. For example, a linear dopant concentration from essentially pure silicon substrate to, say, $10^{22}$ cm$^{-3}$, at the layer surface is demonstrated. The concentration in a layer can change according to another kind of function, which is non-linear, such as exponential function, for example. Preferably said concentration change is a linear function or another analytical function, but it is not limited to that/those. According to an embodiment of the invention there can be even several layers, in which each the concentration of a dopant is a constant, linearly changing in a layer or changing according to a function or a combination of functions to define a concentration gradient across the layer.

Let us illustrate such a layer structure according to an embodiment of the invention, by a first example in which there is on a silicon substrate a layer structure, comprising three sublayers 101a, 101b and 101c. There is a first sub-layer 101a, comprising B doped silicon, doped to a constant concentration through out the sub-layer. In a second sub-layer 101b, Ge is used as a dopant to dope a linear concentration on the structure formed by the substrate and the first sub-layer. The concentration is embodied by an increasing concentration in FIG. 1D, but is not limited thereto. One should notice that the concentration of a dopant can in an embodiment of the invention be even higher than the concentration of the silicon atoms, especially when the dopant is Ge in an embodiment of the invention in which the concentration is not constant through the layer thickness. In such a case, the silicon should not be considered as dopant, although the concentration may be locally smaller. There is also a third layer in the example, in which C has been used as a dopant but doped on the second sub-layer 101c so that C concentration first increases exponentially up to the middle of the third layer, but then decreases linearly to zero at the third layer surface. The corresponding concentration gradients are apparent from the curves indicated by the same number as the layer in the figure. The concentration as a function of sub-layer thickness is indicated in the direction, which is perpendicular or essentially perpendicular to the plane defined by the substrate surface.

According to a second example, two of the sub-layers, say 101b and 101c, of the first example can comprise also another dopant each, respectively in addition to Ge or C, which can have a different concentration profile as the one in the layer of the first example. According to a third example, the growing temperature of forming the layer 101a is selected to be between 1050° C. and 1095° C. The growing temperature of forming layer 101b is selected to be between 1100-1200° C., advantageously, but however equal or less than 1150° C. The third layer 101c in the example is formed in growing temperature 850° C.

In addition, it is also possible to grow strained Si-layers according to an embodiment of the invention, in which embodiment the layer growing utilizes germanium dopant for a grown layer on a silicon substrate.

According to a variant of such an embodiment of the invention, the growing temperature is quite low, say in the range 600-900° C., and so silane or dichlorosilane can be used as the source gas for Si. Ge can be used as dopant in a layer, but other shown dopants as well, according to FIGS. 1C and/or 1D. The last layer of the SiGe can be grown to thickness of few micrometers and before the strained Si-layer, which can have a thickness of 0.1-0.2 μm.

According to a fourth example, on a substrate that is a pure silicon substrate, a germanium doped layer is grown to a constant thickness of 1-3 μm followed by a thin layer of silicon having a constant thickness of 0.1-0.2 μm.

According to a fifth example, the germanium doped layer of the fourth example has a gradient defining a increasing concentration of germanium in the doped layer, from the concentration, say 0% for instance, in the doped layer at the substrate surface to 35% at the opposite surface. The thin silicon layer according to fourth example is made directly on the germanium-doped layer.

According to a sixth example, the layers of fifth example are made on a boron-doped layer, similar to that of 101a.

According to a seventh example, in the growing phase m2-m3 more than one dopants are used for a layer. In an embodiment of the invention such dopants can comprise a co-dopant. Co-dopant is a dopant used within at least partly same time or process phase with said dopant.

So those skilled in the art can understand from the embodiments of the invention and examples shown that a process according to an embodiment of the invention can be used to form different kind of layer structures as exemplary embodied, each within its own thermal conditions, but those skilled in the art also realize that the given exemplary numerical values are not limiting the invention to the mentioned exemplary sub-ranges only, nor to the compositions, nor to the gradients embodied thereof in the spoken layers and/or sub-layers.

The layers are not shown in scale. Therefore those skilled in the art understands that any relative measures between the objects in the FIGS. 1C and/or 1D should not be used for judging any geometrical properties or dependences there between in detail, but can considered in a general level an example on such a layer structure on a wafer.

Figure 2:
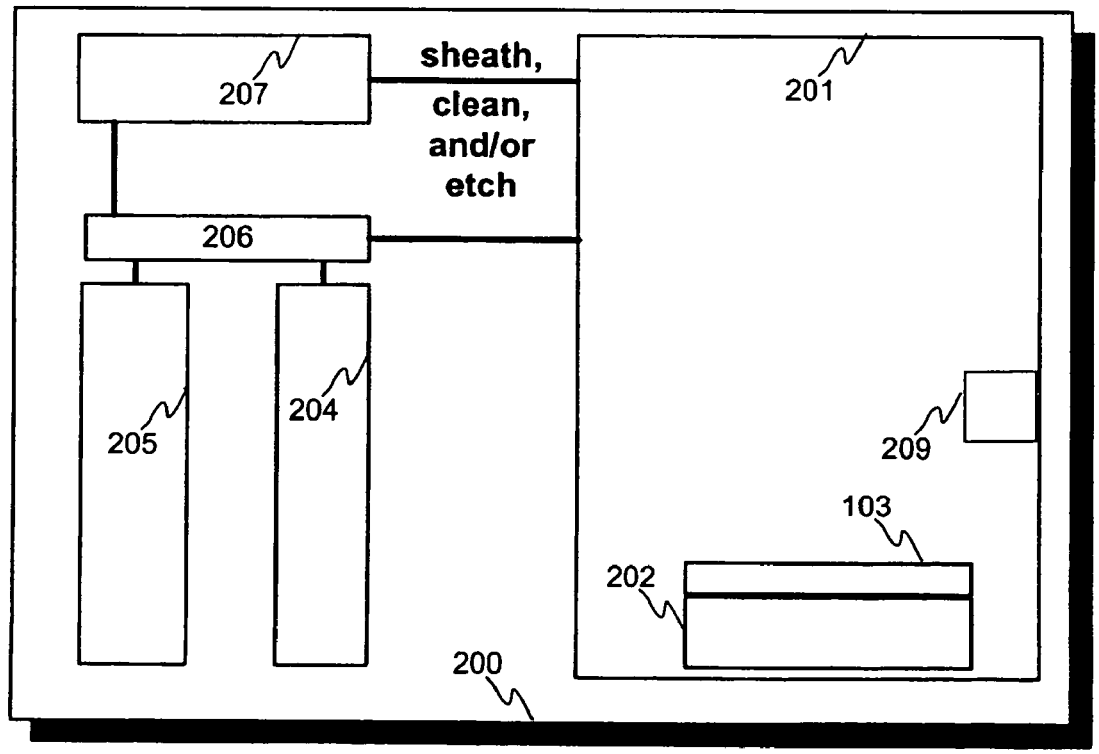
FIG. 2 illustrates a diagram of the CVD arrangement, including a silicon gas source, dopant source, deposition chamber, susceptor and wafer.

FIG. 2 illustrates a diagram of the CVD arrangement 200 according to an embodiment of the invention. Such an arrangement can comprise a deposition chamber 201 as a reaction chamber 201, susceptor 202 and the wafer 103 to be used for growing a layer on the substrate wafer. The arrangement comprises according to an embodiment of the invention, also silicon gas source 204 and/or a source for the dopant(s) 205, which can be embodied for instance by a TCS bubbler and a GeCl$_4$ bubbler, respectively. According to an embodiment of the invention the sources 204 and/or 205 can be arranged to have a control, in order to facilitate dopant profile management in a layer and/or sub-layer in accordance to the examples referring to the FIG. 1D.

According to an embodiment of the invention the arrangement comprises also a cleaning means 207 arranged to clean the deposition chamber 201 or a particular part of it e.g. a wall or susceptor or a combination of suitable part thereof with a cleaning agent. Cleaning agent can be a hydrogen halide arranged in to the reaction chamber in order to remove material from the reactor walls in order to keep the walls sufficiently clean and/or in homogeneous composition. In an embodiment of the invention, the cleaning agent can be the same as the etchant used in the etching phase.

The piping to lead each precursor, cleaning agent or etchant into the reaction chamber is not shown inside the chamber 201 in the FIG. 2, nor any valves or other such details or timers to select a moment and/or duration for each precursor input or the order and an amount thereof are not shown neither for clarity reasons.

The heating means 209 as arranged to heat the reaction chamber 201 are only schematically drawn into the deposition chamber 201, but the correct placement or the internal structure of it as such arranged to produce the heat into the chamber can vary form one chamber to another, and is not limited to the way shown in the FIG. 2, as those skilled in the art familiar with the known CVD processes should know.

According to an embodiment of the invention, the arrangement can have a sheath gas provider (not shown separately in the FIG. 2) arranged to surround the wafer with an appropriate gas atmosphere, such as $H_2$, for instance, or He, Ar and/or another noble gas, in order to prevent the wafer contamination by particles during changing conditions, for instance. In such an embodiment the sheath gas can be arranged to flow and thus compensate diffusion, gravitational settling etc. deposition mechanism that would allow particles to deposit on to the wafer and/or the layers.

Such embodiment with the sheath gas provider may advantageously be utilized between changing the layer specific precursors and/or during stabilization of the mass flows. Such sheath gas provider can be arranged to be independent on the cleaning agent in the cleaning means 207, although may be advantageously used with the cleaning means. The sheath gas provider may be separated or directly integrated with the cleaning means, depending on the timing and thus the further details of the process according to the particular embodiment in question. Sheath gas provider can have an own line (not shown separately) for the purpose of providing sheath gas although cleaning means 207 have a line schematically drawn between part 207 and 201. In FIG. 2 a sheath gas line is indicated by the line between the cleaning means 207 and the camber 201, the line shown with word 'sheath'.

Figure 3:
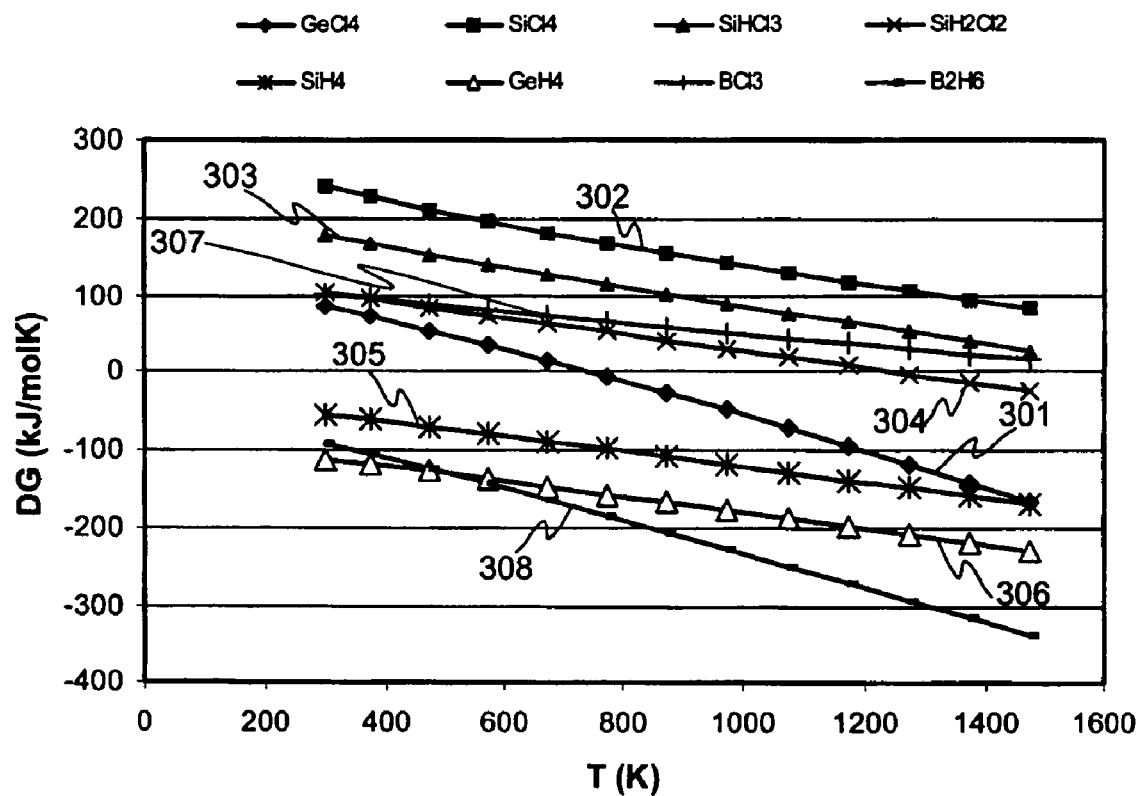
FIG. 3 illustrates results of Gibbs free energy calculations for some halides and hydrides.

FIG. 3 illustrates results of Gibbs free energy calculations for some halides and hydrides. Change in Gibbs free energy ΔG(T) [kJ/molK] as a function of growing temperature T is shown for a reaction (1) comprising Cl:

$$M_kH_nCl_m(g)+(m-n)/2H_2(g)\leftrightarrow kM(s)+mHCl(g), \quad (1)$$

but for a reaction (2) for a hydride:

$$M_kH_n(g)\leftrightarrow kM(s)+n/2H_2(g) \quad (2)$$

The calculus was made in the growing temperature range of 300 K to 1500 K and resulting dependence curves (301, 302, 303, 304, 305, 306, 307 and 308) are shown for considered compounds (capital $M_k$ representing Ge, Si, or B while the index k depends on the stoichiometry of the particular hydride $GeCl_4$, $SiCl_4$, $SiHCl_3$, $SiH_2Cl_2$, $SiH_4$, $GeH_4$, $BCl_3$ and $B_2H_6$, respectively. Nevertheless, the shown elements are not intended to limit a hydride-comprising element M nor the index k by any means as a precursor. However, those skilled in the art appreciate a notice that potential unstable hydride compositions (radicals, for instance), that happen to accidentally fall in to the scope of the indexes, are thus not applicable as such for the embodied process, and are to be however excluded.

The result indicates that silane, germane and diborane are particularly unstable at even moderately elevated growing temperatures. Compounds containing more chlorine are much more stable for the embodiments of the invention. The same is believed to be true for other halides, for instance compounds containing bromine, fluorine and iodine. The use of halides also increases the concentration of halogens in the reactor further tilting the balance of the reactions against deposition in a process according to the embodiments of the invention. This has the beneficial effect that deposition on the quartz walls is reduced even further. In addition, the harmful tendency of silanes to dissociate in the vapor phase is greatly reduced.

Figure 4:
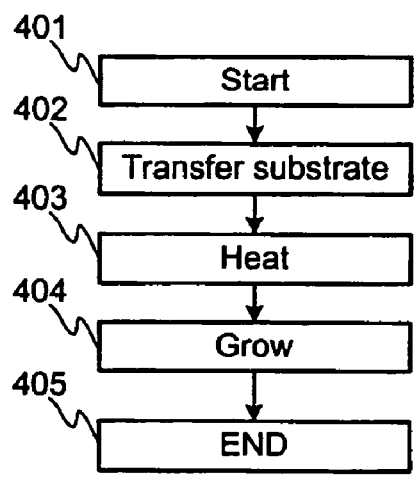
FIG. 4 illustrates a method according to an embodiment of the invention, and FIG. 5A illustrate a photograph of a reactor used in a process according to an embodiment of the invention.

FIG. 4 illustrates a method according to an embodiment of the invention and the third aspect thereof, a method of growing dopant doped silicon layer in a CVD process, comprising epitaxial silicon or polycrystalline silicon.

The method comprises starting 401 in which the procedure is initiated by preparing the substrates, setting the process precursor and/or adjusting the other parameters for the process. In step 401 the reaction chamber may be cleaned with a cleaning agent and/or sheath gas may be applied to the substrate in order to protect the substrate, if necessary. A substrate wafer is placed into a deposition chamber of a chemical vapor deposition (CVD) apparatus at the beginning. The substrate can comprise a silicon wafer, a silicon wafer coated with an insulating film, or the substrate can be made of some other suitable material such as germanium or sapphire. In step 402 the substrate or an ensemble of such substrates, wafers for instance, are transferred into a deposition chamber. The chamber is in step 403 heated with the substrate(s) and when a suitable growing temperature is reached, the temperature during the growing phase can be maintained constant or it can be varied according to a predetermined program. In such an embodiment of the invention in which the local dopant concentration in the layer is a function of the distance across layer thickness, the deposition rate of the dopant can be controlled with the temperature. However, the temperatures in the growing phase are advantageously selected from the range of 600-1250° C. In step 404 a layer is grown by a dopant originating to a dopant comprising halide and/or silicon-comprised halide as a silicon source gas. In case of a dopant concentration gradient to be doped in to the layer, the heating phase 403 and the depositing phase can occur as a combined phase. In the step 405 the growing is ended, the substrate with the grown layers is prepared to be taken away from the reaction chamber.

The substrate and/or the process is about to be set for an exposure of another layer of dopant, which layer may be similar or different than the previous layer, dependently on the desired structure of layers for an application. In suitable part, the mentioned steps or their practical sub-phases may be occurring in some part at the same time, especially such steps which involve preparations for the next step. Such preparatory steps may be performed also during some other sub-phase or step, while growing a layer in a chamber, for instance, where applicable. The method is not limited to processing a single wafer at a time, but multiple wafers can be processed simultaneously. Also more than one reactor may be used in series for production of layers. So it is possible to arrange each reactor for cascading a certain layer structure manufacturing if desired.

The cleaning agent is introduced into the process by cleaning means to clean the reaction chamber with a cleaning agent. Cleaning agent can be a hydrogen halide arranged in to the reaction chamber in order to remove material from the reactor walls in order to keep the walls sufficiently clean and/or in homogeneous composition. The cleaning step by the cleaning agent is not drawn into the FIG. 4, but cleaning can be made not only at the beginning or at end of the process, but also according to an embodiment of the invention also at the beginning, during and at the end of the process. Although cleaning agent has been described as a hydrogen halide, it is not limited only thereto, although cleaning agent comprises advantageously elements of the precursors of the CVD process. It is also possible to use more than one cleaning agents in an embodiment of the invention. A cleaning agent may partly form already in the process but can be added to a sufficient amount in order to keep the reactor sufficiently clean. Adding can be made at an appropriate step, provided that the cleaning agent is needed more than formed in the process. According to an embodiment of the invention, it is possible to protect the wafer to be processed by the sheath gas atmosphere while the etching and/or cleaning of the chamber is already started.

One should notice that all practical fine details of the method are not illustrated in order to keep the presentation clear. The phases of preparatory nature of the substrate and/or chemicals involved as well as operation, initiation resetting and/or maintenance of the manufacturing arrangement in use are not shown as considered not necessary for those skilled in the art.

FIG. 5A illustrates advantages of the process according to the embodiments of the invention.

FIG. 5A is a photograph of a reactor part for showing the cleanliness of the process according to the embodiments of the invention, whereas FIG. 5B is a photograph of a reactor part used in a process according to the known art. The cleanliness is demonstrated by the sharp image of the reactor part in FIG. 5A in comparison to the reactor part in FIG. 5B.

The cleanliness is a great advantage of a process according to the embodiments of the invention, because it allows the product to be of even higher quality than before. Because of the yield of the process is improved due to the cleanliness of the new process, it is more cost effective due to the increased number of acceptable products. In addition the cost effectiveness of the process is also improved by the decreased chemical consumption and, greatly reduced process cycle time in comparison to that in the state of the art.

Those skilled in the art, having read and understood the disclosure of the embodiments of the invention as described herein, knows several ways to vary the details of the process and/or the arrangement according to the shown exemplary embodiments of the invention without deviating from the scope and spirit of the invention as claimed in the following.

The invention claimed is:

1. A CVD (Chemical Vapor Deposition) growing process of high concentration dopant doped silicon layers comprising epitaxial silicon or polycrystalline silicon on a substrate, wherein the dopant concentration is at least $1 \times 10^{19}/cm^3$ and the process is a high temperature process wherein a high temperature range extends from 900° C.-1250° C., comprising:

baking the substrate in a reactor to a baking temperature of 900° C.-1250° C.;

feeding a halide into the reactor, at the high temperature range, for enhancing at least one of process purity and reactor purity;

feeding a silicon comprised halide as a silicon source gas into the reactor, at the high temperature range, during a growing phase;

feeding a substance comprising the dopant into the reactor, at the high temperature range, during the growing phase;

heating the substrate in the reactor at a growing temperature of 900° C.-1250° C., during the growing phase;

removing the substrate from the reactor;

cooling the reactor; and cleaning the reactor at a cleaning temperature after said cooling;

wherein the substance comprising the dopant comprises at least one of the following: a B-halide, $BCl_3$, and $BCl_3$ in combination with $GeCl_4$, wherein the silicon source gas comprises at least one of the following: a Si-halide, DCS, TCS, and $SiCl_4$; and wherein a combination of the silicon source gas and the substance comprising the dopant is a combination other than a combination consisting of TCS and $BCl_3$ dopant, and is a combination other than a combination consisting of DCS and $GeCl_4$.

2. A CVD growing process according to claim 1, wherein said silicon comprised halide is a compound of form of formula $Si_xH_yHal_z$.

3. A CVD growing process according to claim 2, wherein in the formula, x as a relative number of silicon atoms in said silicon comprised halide formula is less than 4.

4. A CVD growing process according to claim 3, wherein in the formula, x as a relative number of silicon atoms in said silicon comprised halide formula is equal to or less than 2.

5. A CVD growing process according to claim 2, wherein y as a relative number of hydrogen atoms in said silicon comprised halide formula is equal to or less than 2x+2.

6. A CVD growing process according to claim 2, wherein z as a relative number of halogen atoms in said silicon comprised halide formula is equal to 2x+2 minus y.

7. A CVD growing process according to claim 1, wherein said halide comprises halogen compounds of one halogen species.

8. A CVD growing process according to claim 1, wherein said halide comprises halogen compounds of multi-halogen species.

9. A CVD process according to claim 1, wherein said growing temperature is between 900-1150° C.

10. A CVD process according to claim 1, wherein said growing temperature is between 1000-1050° C.

11. A CVD process according to claim 1, wherein said growing temperature is between 1050-1250° C.

12. A CVD process according to claim 1, wherein said growing temperature is between 1050-1150° C.

13. A CVD process according to claim 1 used for manufacturing a wafer with a dopant doped surface structure.

14. A method of growing high concentration dopant doped silicon layer comprising epitaxial silicon or polycrystalline silicon, wherein the dopant concentration is at least $1\times10^{19}/cm^3$, in a high temperature CVD process comprising:

transferring a substrate into a deposition chamber for growing at least one high concentration dopant doped silicon layer, heating the substrate and maintaining at a high growing temperature, which is between 900° C. and 1250° C., feeding a halide into the reactor, the reactor at the high growing temperature, for enhancing at least one of process purity and reactor purity;

feeding a substance comprising the dopant into the reactor, the reactor at the high growing temperature, during a growing phase; and growing at least one silicon layer on the substrate by using a halide precursor comprising a dopant and by using silicon comprised halide as a silicon source gas, wherein the method comprises using at least one of a B-halide, $BCl_3$, and $BCl_3$ in combination with $GeCl_4$, as said halide precursor, wherein the method comprises using at least one of a Si-halide, DCS, TCS, and $SiCl_4$, as said silicon source gas, and wherein the combination of the silicon source gas and the substance comprising the dopant is a combination other than a combination consisting of TCS and $BCl_3$ dopant and is a combination other than a combination of DCS and $GeCl_4$.

15. A method of claim 14, wherein the method further comprises an etching phase of the chamber with an etching temperature and an etching period.

16. A method of claim 15, wherein the etching period length is dependent on at least one of the following quantity in the growing phase: growing temperature and halide precursor composition.

17. A method of claim 14, wherein the substrate comprises a wafer.

18. A method of claim 17, wherein the substrate comprises silicon.

19. A method of claim 17, wherein the wafer is a wafer for wafer bonding.

20. A CVD growing process according to claim 1, wherein said substance comprising a dopant additionally comprises a Ge-halide.

21. A CVD growing process according to claim 20, wherein said dopant is $BCl_3$.

22. A process for growing layers onto a substrate in a reactor in a CVD process at high temperature above 900° C., wherein onto the substrate at least one layer comprising epitaxial silicon or polycrystalline silicon is grown by using a silicon comprised halide as a source gas in said process comprising:

preparing the substrate for heating;

heating the substrate in the reactor to a baking temperature, wherein the baking temperature is above 900° C.;

baking the substrate in the reactor at said baking temperature in an atmosphere comprising $H_2$, adjusting optionally the temperature in the process to a growing temperature for a growing phase for growing at least one layer on said substrate, wherein the growing temperature is above 900° C., growing a silicon structure comprising at least one high concentration dopant doped silicon layer on the substrate, in an atmosphere comprising at least silicon source gas and dopant source gas, wherein the source gas comprises at least one of the following TCS and $SiCl_4$ in high temperature; and wherein the dopant concentration is at least $1\times10^{19}/cm^3$ and the dopant comprises at least one of the following $GeCl_4$ and $BCl_3$ in high temperature.

* * * * *